United States Patent
Nyberg et al.

(10) Patent No.: US 7,465,378 B2
(45) Date of Patent: Dec. 16, 2008

(54) METHOD FOR REACTIVE SPUTTERING DEPOSITION

(75) Inventors: Tomas Nyberg, Uppsala (SE); Sören Berg, Uppsala (SE)

(73) Assignee: Cardinal CG Company, Eden Prairie, MN (US)

( * ) Notice: Subject to any disclaimer, the term of this patent is extended or adjusted under 35 U.S.C. 154(b) by 10 days.

(21) Appl. No.: 10/474,544

(22) PCT Filed: Jun. 6, 2002

(86) PCT No.: PCT/SE02/01110

§ 371 (c)(1),
(2), (4) Date: Mar. 22, 2004

(87) PCT Pub. No.: WO03/006703

PCT Pub. Date: Jan. 23, 2003

(65) Prior Publication Data

US 2004/0149566 A1    Aug. 5, 2004

(30) Foreign Application Priority Data

Jul. 13, 2001    (SE) .................................. 0102024

(51) Int. Cl.
*C23C 14/00* (2006.01)
*C23C 14/32* (2006.01)
(52) U.S. Cl. ................... 204/192.12; 204/192.1
(58) Field of Classification Search ............ 204/192.1, 204/192.12, 192.15, 298.01, 298.11, 298.02
See application file for complete search history.

(56) References Cited

U.S. PATENT DOCUMENTS

| | | | | |
|---|---|---|---|---|
| 3,864,239 A | * | 2/1975 | Fletcher et al. | ........ 204/298.06 |
| 4,434,037 A | | 2/1984 | Crank | |
| 4,865,709 A | * | 9/1989 | Nakagawa et al. | ..... 204/192.12 |
| 5,096,562 A | * | 3/1992 | Boozenny et al. | ...... 204/298.22 |
| 5,100,527 A | * | 3/1992 | Stevenson et al. | ...... 204/298.22 |
| 5,492,606 A | * | 2/1996 | Stauder et al. | ......... 204/192.12 |
| 5,616,224 A | * | 4/1997 | Boling | .................. 204/298.08 |

(Continued)

FOREIGN PATENT DOCUMENTS

WO    WO 92/02659    2/1992

(Continued)

OTHER PUBLICATIONS

S. Berg, T. Nyberg, H-O Blom and C, Nender (1998). Modeling of the Reactive Sputtering Process. Bristol and Philadelphia: IOP Publishing, Ltd.

*Primary Examiner*—Edna Wong
*Assistant Examiner*—Luan V Van
(74) *Attorney, Agent, or Firm*—Fredrikson & Byron, PA

(57) ABSTRACT

The invention is a method for obtaining a reactive sputtering process with a reduced or eliminated hysteresis behavior. This is achieved by focusing the ion current onto a small area, a reduced erosion area (14), which is in constant motion along the target (10) to avoid melting of target material. This means that the current density is very high at the reduced erosion area (14) while the average overall current density is significantly lower. The problem with arcing during reactive sputtering will be suppressed since the compound layer is effectively removed if the current density is sufficiently high. Moreover, the high current density results in a substantial increase of the fraction of ionized sputtered species.

16 Claims, 6 Drawing Sheets

U.S. PATENT DOCUMENTS 5,685,959 A    11/1997  Bourez et al.
5,814,195 A *   9/1998  Lehan et al. ........... 204/192.12
6,051,113 A *   4/2000  Moslehi ................. 204/192.12
6,183,614 B1 *  2/2001  Fu .......................... 204/298.2
6,365,010 B1    4/2002  Hollars
6,440,282 B1 *  8/2002  Wada et al. ............... 204/298.2

FOREIGN PATENT DOCUMENTS

WO    WO 01/23634    4/2001

* cited by examiner

METHOD FOR REACTIVE SPUTTERING DEPOSITION

FIELD OF THE INVENTION

The present invention relates to the reactive sputtering deposition process.

BACKGROUND OF THE INVENTION

Sputtering is a preferred industrial thin film coating process. In this process, a target material is deposited over a substrate area. By bombarding the target with gas ions accelerated by a high voltage, target atoms are caused to eject, or sputter, from the surface. Target particles then traverse the sputtering chamber and are deposited onto the substrate as a thin film.

For some sputtering applications, it is in several ways favorable if a large fraction of the sputtered atoms is ionized. Firstly, the sputtered ions might be attracted to the substrate by applying a bias to the latter. This will add energy to the growing film, which is beneficial for the film growth. Secondly, the attracted ions will have a preferential perpendicular direction when arriving onto the substrate surface which enables deposition in groves and trenches. Thirdly, if the fraction of ions is sufficiently large, it may be possible to run the process in a self-sustained mode. This means that ions from the target material sputter themselves without addition of an extra (inert) gas. This will of course result in a much cleaner process where no inert gas species is contaminating the deposited film.

The fraction of ionized sputtered species is correlated to the target ion current density. A higher current density implies a larger fraction of ionized species. Generally, the maximum tolerable current density is limited by the efficiency of the target cooling system.

By adding a reactive gas to the sputtering process, it is possible to reactively sputter thin films consisting of oxides, nitrides, carbides etc. The reactive sputtering process has found widespread applications, in for example coating of tools, decorative coatings, window glasses, plastic webs, electronic components, data-storage components etc. Due to its highly complicated behaviour, the reactive sputtering process is associated with a number of difficulties. The process usually exhibits a behaviour presenting a hysteresis effect, which makes it difficult to control. Moreover, the deposition rate of compound is usually much lower than the deposition rate of pure metal (sometimes as much as 10-20 times lower). Finally, deposition of insulating compound thin films from metal targets implies charging and subsequent arcing at the target.

The only way to avoid hysteresis in the reactive sputtering process, so far, has been to increase the external pumping speed of reactive gas. This may sometimes be realized for small systems but leads to unrealistically high pumping speeds in large industrial systems.

In an ideal controllable process, reactive sputtering would be carried out from a clean metal target and the metal atoms would react with the gas when arriving at the substrate. It would then be possible to change the compound concentration in the deposited film by the reactive gas flow. Unfortunately, it is not possible to obtain these ideal conditions because the reactive gas also reacts with the target, resulting in compound formation at the target. Experiments have previously been carried out in order to introduce a pressure gradient in the processing chamber and thereby reduce compound formation at the target. Such a gradient is not easily obtained and the impact on the process behaviour has so far been quite small.

To solve the problem with charging and arcing during deposition of insulating films, it is possible to make use of specially developed power supplies which add extra positive pulses in order to neutralize the target.

Another way to partly overcome this problem is to increase the total gas pressure so that a substantial fraction of the sputtered metal from the high-erosion parts of the target scatters back onto the low-erosion parts of the target, thus making this part more metallic which suppresses charging and subsequent arcing.

The concept of using a magnet that is moving relative to the target to induce a moving erosion area is well known and described in several patents and patent applications, see for example U.S. Pat. No. 6,183,614, WO 01/23634 and WO 92/02659. In U.S. Pat. No. 6,183,614, asymmetric magnetic fields are introduced in order to achieve advantageous high-density plasma sputtering. WO 01/23634 uses a plurality of magnets to induce a magnetic field having a predefined arbitrary shape and thereby improve material utilization. An alternative target set-up is disclosed in WO 92/02659, which employs a cylindrical magnetron for the purpose of reducing arcing.

Problems associated with prior art sputtering processes remain and there is a strong demand for an improved sputtering method.

SUMMARY OF THE INVENTION

A major object of the present invention is to provide a high-rate reactive sputtering process with a reduced or eliminated hysteresis behaviour. This implies a more controllable and efficient reactive sputtering process, where the deposition rate of compound films is significantly higher than in prior-art methods.

This object is achieved in accordance with the appended claims.

The invention is a method for obtaining a reactive sputtering process with a reduced or eliminated hysteresis behaviour. This is achieved by increasing the ion target current density in the sputtering process by reducing the area from which sputtering takes place. To compensate for the increased local heating, the reduced area from which sputtering takes place moves along the target.

It should be noted that for certain combinations of target materials and requirements on the deposition rate, the target will not melt during operation even at static conditions, in particular if the power is switched on and off, so that the average power is less than the power needed to cause local heating of the target. Nevertheless, the maximum deposition rate can always be increased if the power is spread out over a larger area. It is however crucial that the reduced area, in accordance with the present invention, is small enough to obtain a reactive sputtering process with eliminated or at least considerably reduced hysteresis. It is also, especially in connection with industrial applications with high requirements for efficient processes, important that the reduced area is moving at a speed high enough to prevent local melting of the target. Moreover, the speed of the reduced area should be low enough to make sure that the vast majority of the sputtered species in the reactive sputtering process are metal atoms.

The method according to the present invention has several advantages compared to conventional sputtering techniques. As a consequence of the high current density, the fraction of ionized sputtered species will increase dramatically, which is desirable for the reasons given above. Another major advantage is that the above-described problems associated with a sputtering process operating in reactive mode, particularly the problem with hysteresis, will be reduced or eliminated. Furthermore, the problem with arcing during reactive sputtering will be suppressed, since the insulating compound material at the target is effectively sputter-removed when the current density is sufficiently high. Finally, the increased ionization rate enables sputtering at lower pressure.

BRIEF DESCRIPTION OF THE DRAWINGS

The invention, together with further objects and advantages thereof, may best be understood by making reference to the following description taken together with the accompanying drawings, in which.

DETAILED DESCRIPTION

Figure 1:
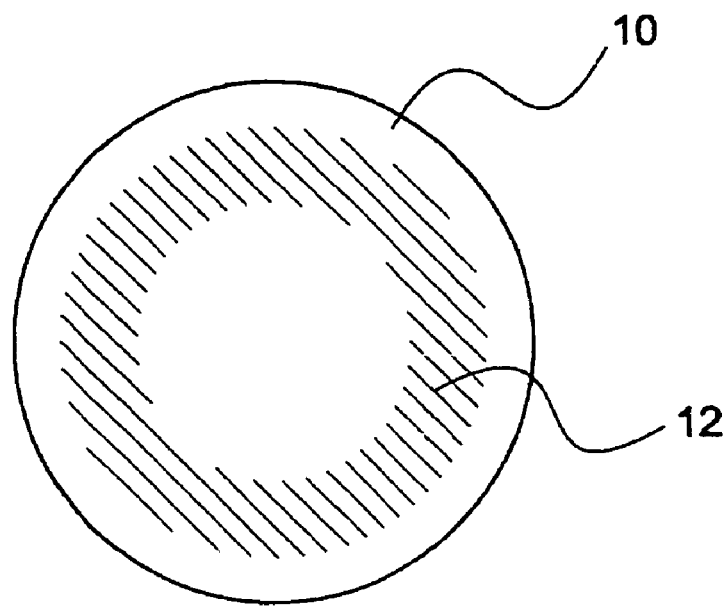
FIG. 1 illustrates the erosion track on a typical prior art DC-magnetron target.

FIG. 1 illustrates the erosion track on a typical prior art DC-magnetron target. Sputtered material is removed from a target 10, whereby an erosion track 12 is formed at the surface of the target 10. Conventional DC-magnetron targets 10 typically have ring-shaped erosion areas 12 extending over a substantial part of the target. Other shapes of targets and erosion areas are also quite frequently used in industrial applications. In the large area deposition industry, it is common to use cylindrically shaped targets. Here, the sputtering takes place from the outer parts of the target from an erosion area parallel to the cylinder-axis. This can be achieved by inserting rod magnets inside the cylindrically shaped target.

Figure 2:
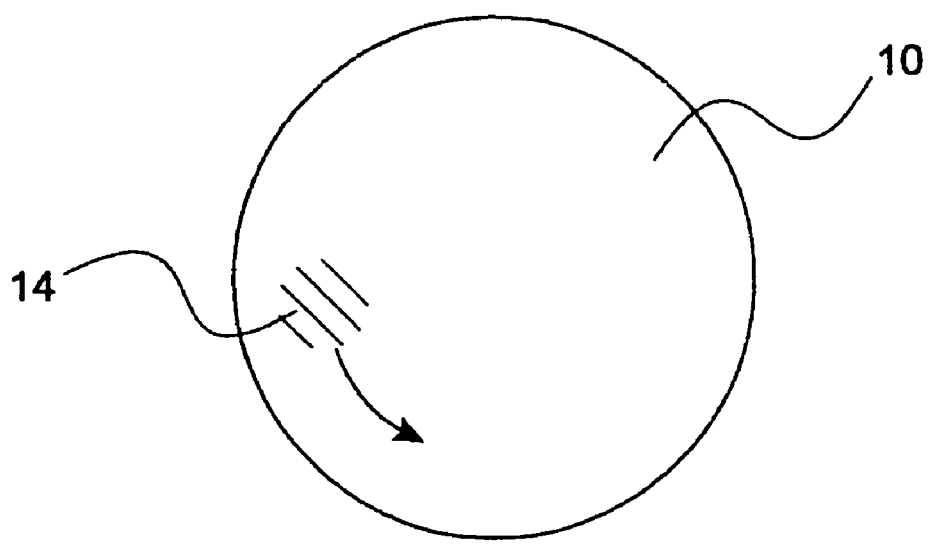
FIG. 2 is an exemplary illustration of a reduced area in constant motion according to the present invention.

The present invention is based on a method to obtain a reactive sputtering process with a reduced or eliminated hysteresis behaviour by reducing the area from which sputtering takes place. Any conventional power supply can be used to generate the ion current to the target, for example DC, RF or pulsed DC power supplies. FIG. 2 is an exemplary illustration of a reduced erosion area in constant motion according to the present invention. To avoid local heating of the target 10 the reduced erosion area 14 should be in constant motion, which in FIG. 2 is indicated by an arrow. Other embodiments of the present invention may disclose other shapes of the reduced erosion area 14, which does not necessarily have to be circular. However, it is crucial that the reduced erosion area 14 is in constant motion to avoid local melting of the target 10. This ensures that the power is spread out so that the average heating over the area of the target 10 is essentially the same as for the large erosion area 12. Of course, embodiments with other types of targets, such as the previously mentioned cylindrical target, may also be used in the present invention, as long as the erosion area is reduced sufficiently to obtain the desired process behaviour.

There are several ways of accomplishing the small erosion area 14 in motion in accordance with the present invention. One approach is to place a small moving magnet behind the target 10. Another approach is to arrange a moving shutter with a small aperture close to the surface of the target 10. The shutter will effectively prevent plasma discharge except at the position of the aperture. For cases where magnets and/or shutters or the like are used to define the erosion zone, moving the target is equivalent to moving the magnets/shutters. Yet another way of obtaining the desired small erosion area 14 in motion would be to split up the target 10 in several parts electrically isolated from each other. By distributing power to one part at a time, it is possible to control the location of the plasma discharge and thereby the area from which sputtering takes place similarly as in the previous approaches. Other possible approaches to obtain a small erosion area 14 in motion along the target 10 also lie within the scope of the present invention.

There are two crucial parameters to control in the method according to the present invention; the size of the reduced erosion area 14 and the speed at which the area 14 is moving along the target 10. As will be evident in the following text, several effects related to these parameters have to be considered in order to obtain a hysteresis-free reactive sputtering process.

Figure 3:
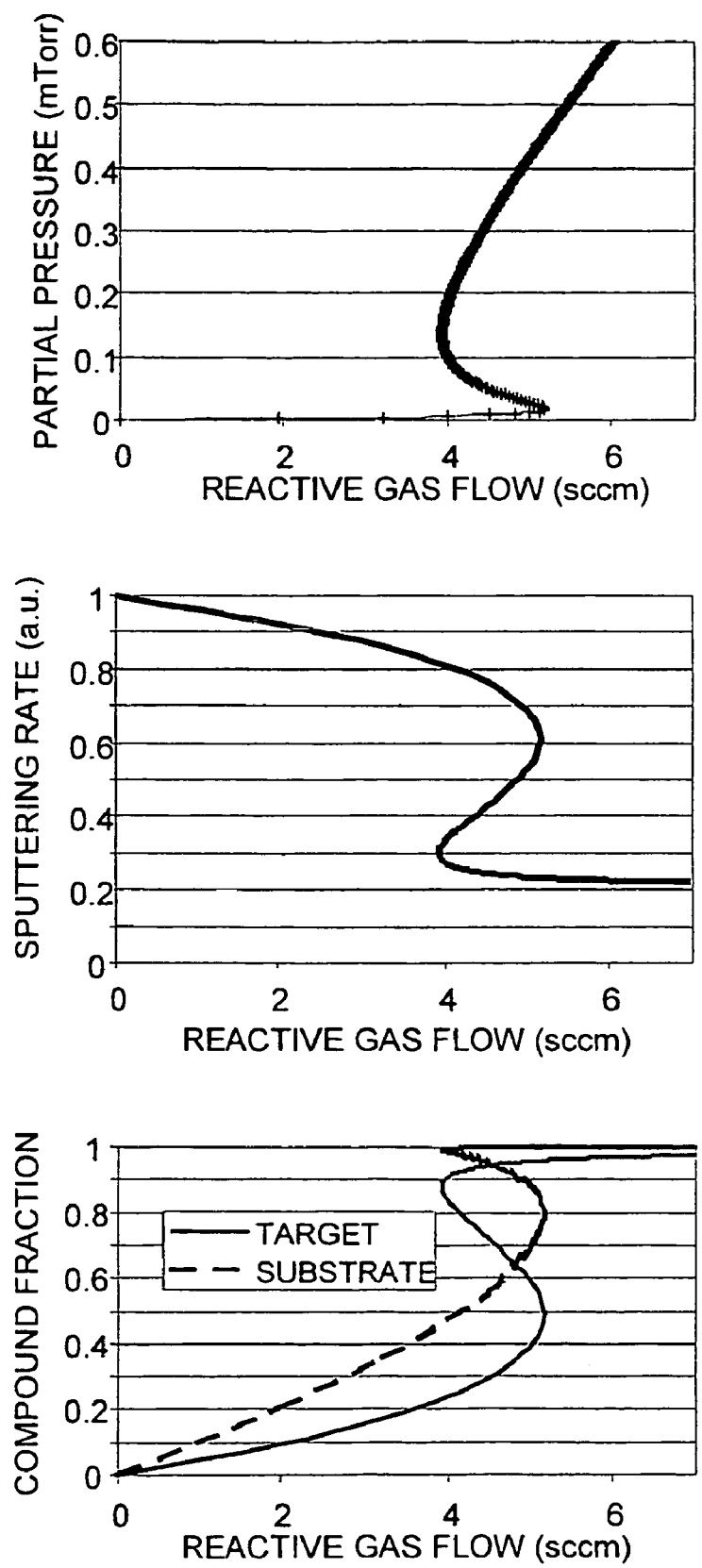
FIG. 3 shows reactive gas pressure, sputtering rate and target- and substrate composition versus reactive gas flow in a reactive sputtering system using a conventional target of normal size.
Figure 4:
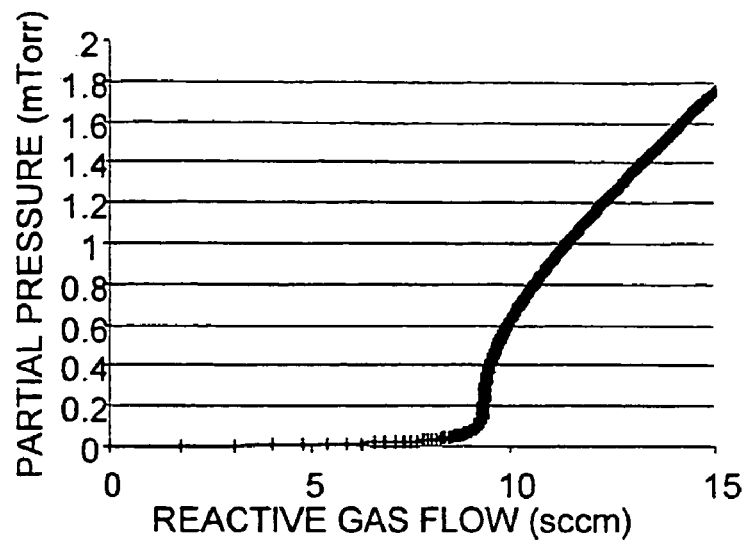
FIG. 4 shows reactive gas pressure, sputtering rate and target- and substrate composition versus reactive gas flow in a reactive sputtering system with a small sized erosion area in accordance with the present invention.
Figure 4:
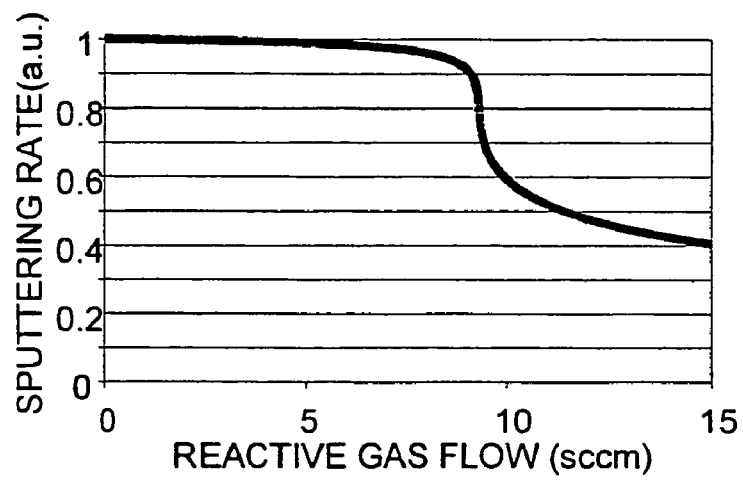
Figure 4:
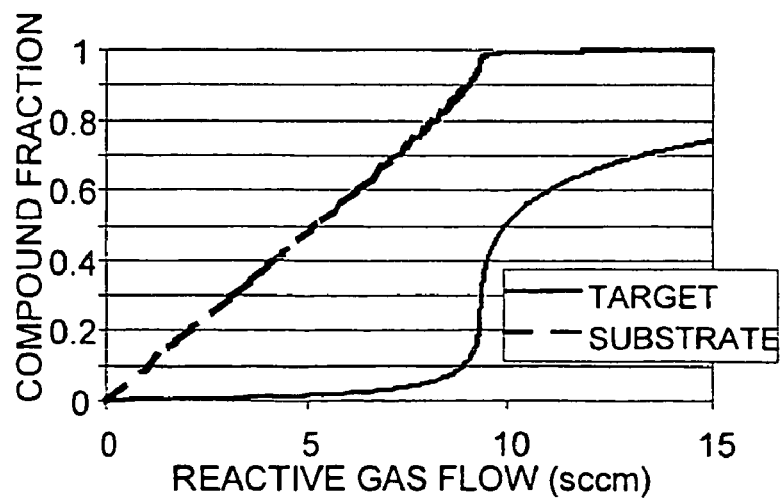

FIG. 3 shows results from simulations of a reactive sputtering system with a target and erosion area of normal size while FIG. 4 shows simulations of a system with a significantly smaller erosion area. The erosion area resulting in FIG. 4 is approximately 30 times smaller than the one resulting in FIG. 3. Graphs of partial reactive gas pressure, sputtering rate and fraction of compound are shown. It is evident that the hysteresis behaviour disappears when the erosion area is significantly reduced. In fact, it can be shown that the hysteresis behaviour can always be eliminated by a sufficiently small erosion area. It should be noted that increasing the current density by increasing the total current while maintaining a large erosion area would not eliminate the hysteresis behaviour. Accordingly, it is from this point of view beneficial to have as small erosion area as possible. But because of cooling problems it is not practicable to have an arbitrarily small erosion area. Under certain circumstances it is equivalent to make use of the moving erosion area 14 described above, instead of using the conventional target 10 with a static erosion track 12 of the same size. But for reasons given above, a moving erosion area can be made much smaller than a static one. This small erosion area has the advantage that a high current density is achieved, which in turn gives a hysteresis-free process as seen in FIG. 4.

It is not possible to precisely specify the size of the erosion area required to obtain the desired positive effects, since this size depends on the employed type of sputtering deposition system. To find out the size needed to obtain the positive effects, one has to reduce the erosion area and then study the hysteresis behaviour for the particular system, in accordance with methods well-know to the man skilled in the art. If the hysteresis effect has been eliminated, or decreased to such an extent that deposition of fully stoichiometric compound films is achievable at a rate close to a metallic sputtering rate, it can be concluded that the erosion area has been reduced sufficiently to obtain the desired effect. The same effect may of course also be obtained if several erosion zones are used instead of one, as long as the total area does not exceed the size needed to obtain this effect. The reduced erosion area can be moved continuously over the surface at constant or variable speed. According to one embodiment of the invention, the erosion zone is caused to jump from one position to another, e.g. by splitting up the target into electrically isolated parts and distributing power to one part at a time.

Figure 5:
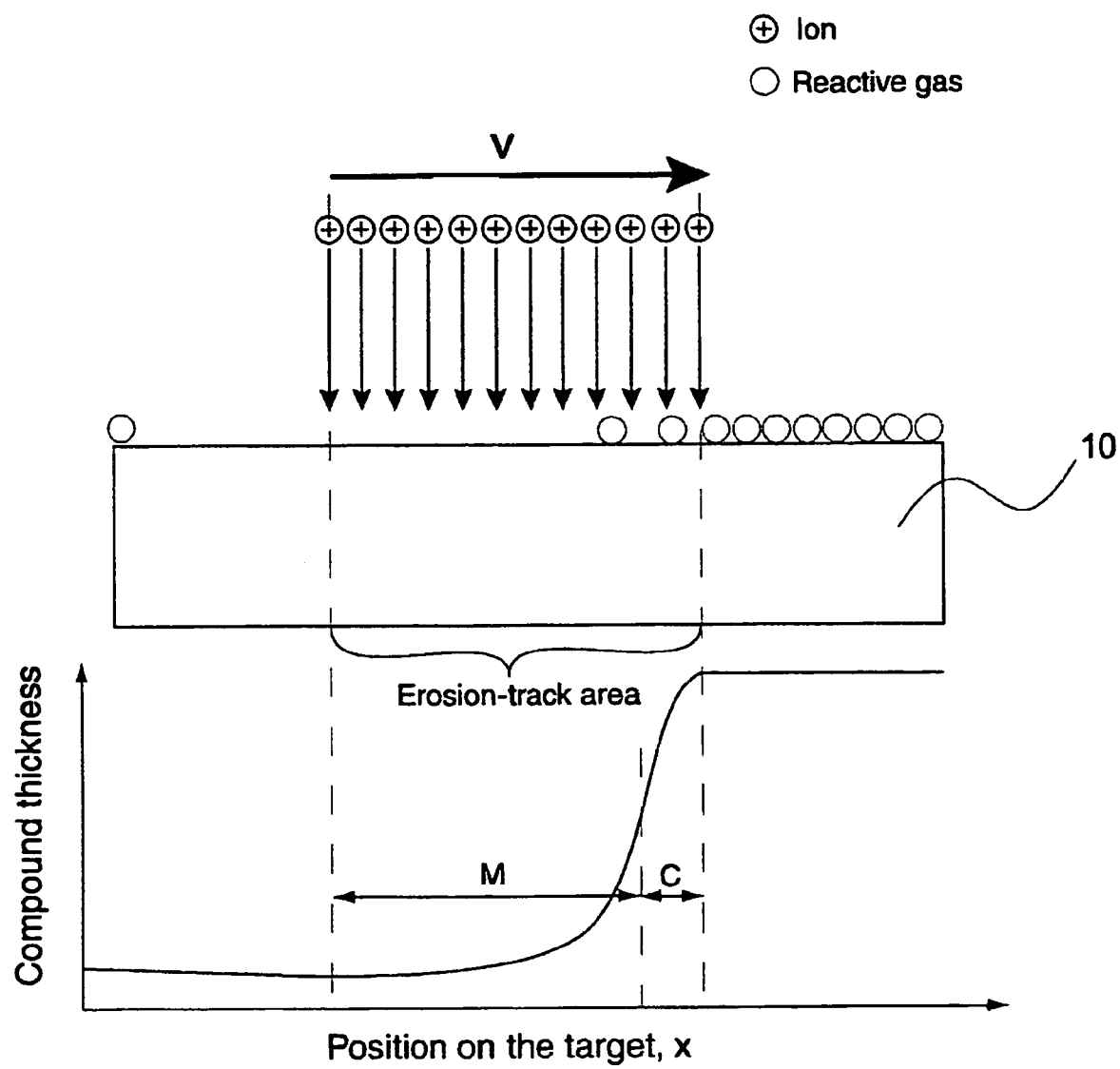
FIG. 5 illustrates the situation at the target surface in a reactive sputtering process when a reduced erosion area moves along it at a speed v, whereby the thickness of the compound layer on the target surface is shown in a diagram as a function of the position on the surface.

FIG. 5 illustrates the situation at the target surface in a reactive sputtering process when the erosion area moves along it at a speed v. It is seen that a certain amount of compound has formed in the area in front of the erosion area. An arbitrary point at the target surface will have this amount of compound before being bombarded by the ions for a certain time. This time is equal to the speed of the erosion area multiplied by its length. As the point enters the erosion area 14, the compound will gradually be sputtered away until a new compositional balance with a substantially lower amount of compound, is reached. When no longer bombarded by ions, the target surface will gradually be more rich in compound again as the reactive gas forms a compound with the metal of the target 10.

When sputtering is performed with a moving erosion area 14, one important criterion to fulfil is that the compound rich part of the target 10 that enters the erosion area 14 is sputtered a sufficiently long time to reach the new compositional balance, which is more rich in metal. In fact, it is crucial that the new compositional balance is reached quite early during the sputtering pulse. In other words, the speed of the erosion area 14 must be low enough to make sure that the target surface is sputtered a relatively short time in compound mode, denoted C in FIG. 5, but most of the time in metal mode, denoted M in FIG. 5. This criterion puts restrictions upon the maximum speed of the erosion area 14. A diagram in FIG. 5 shows the composition on the target surface as a function of the position on the surface of the target 10, when the erosion area moves at the speed v.

Figure 6:
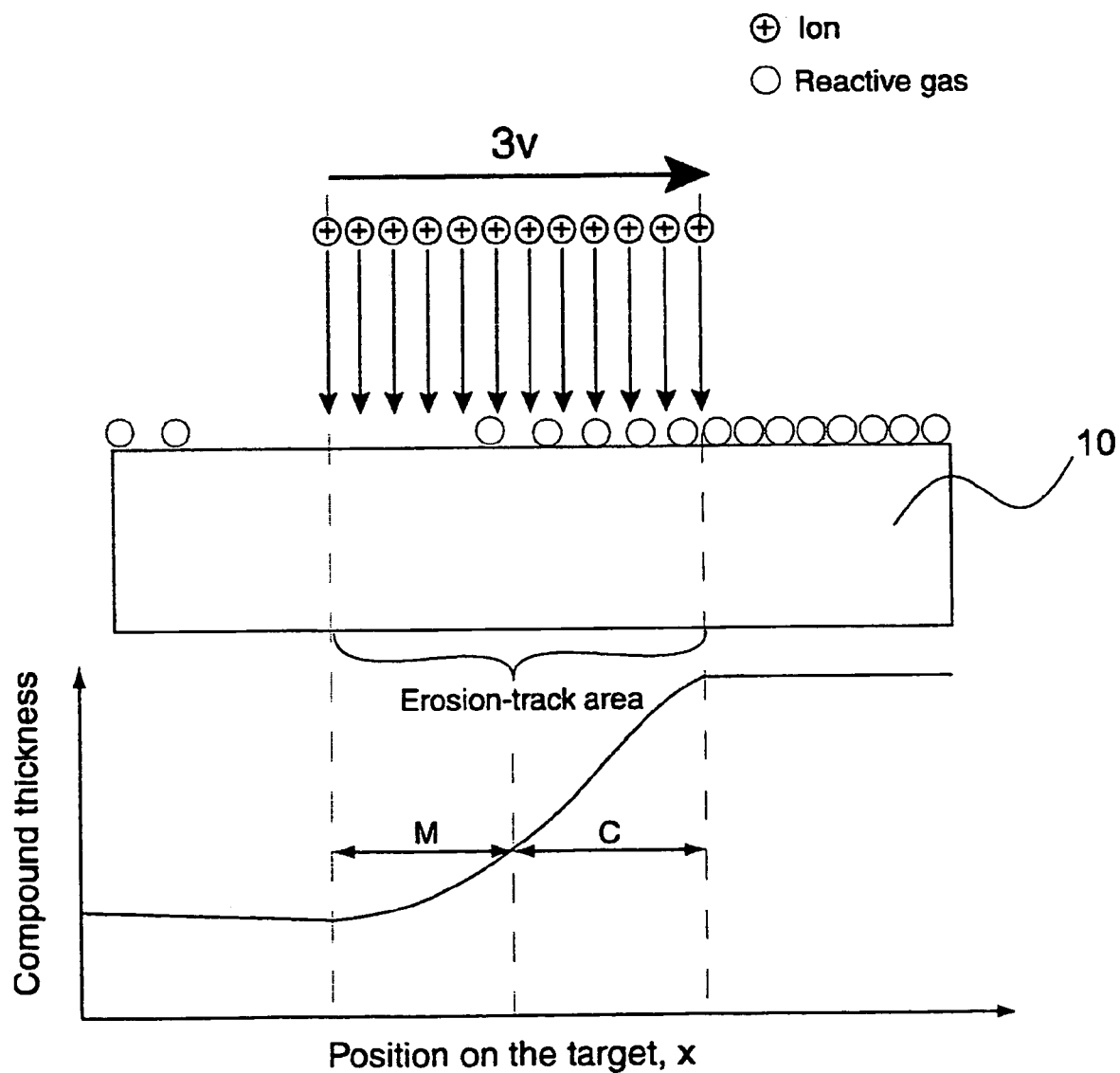
FIG. 6 illustrates the situation at the target surface in a reactive sputtering process when a reduced erosion area moves along it at a speed 3v, whereby the thickness of the compound layer on the target surface is shown in a diagram as a function of the position on the surface.

FIG. 6 illustrates the situation at the target surface in a reactive sputtering process when the erosion area is scanning it at a speed 3v, whereby the thickness of the compound layer on the target surface is shown in a diagram as a function of the position on the surface. The same denotation as in FIG. 5 is used. By comparing FIGS. 5 and 6, it is seen that when the erosion area 14 moves at the speed v, most of the erosion area is in metal mode, while it is mostly compound when the speed is 3v. Thus, the maximum speed of the erosion area 14 should in this case be somewhere between v and 3v for a preferred reactive sputtering process.

Furthermore, the speed of the erosion area 14 has to be higher than a certain minimum speed in order to avoid local excessive overheating or melting of the target 10.

If the speed of the erosion area 14 is above the minimum speed required to avoid melting and below the maximum speed necessary to maintain a major part of the erosion area 14 in metal mode, the overall reactive sputtering process will behave similar to a process with a target 10 having a static erosion track with the reduced size. Since simulations of a small sized static erosion track clearly show that the hysteresis effect disappears, it follows that a sufficiently small moving erosion area 14 also will give a hysteresis-free process provided that the speed is within the above limits. A hysteresis-free reactive sputtering process is very desirable, since it is easy to control. Furthermore, the problem with arcing during reactive sputtering will disappear, since the insulating compound material at the target is effectively sputter-removed when the current density is sufficiently high.

Figure 7:
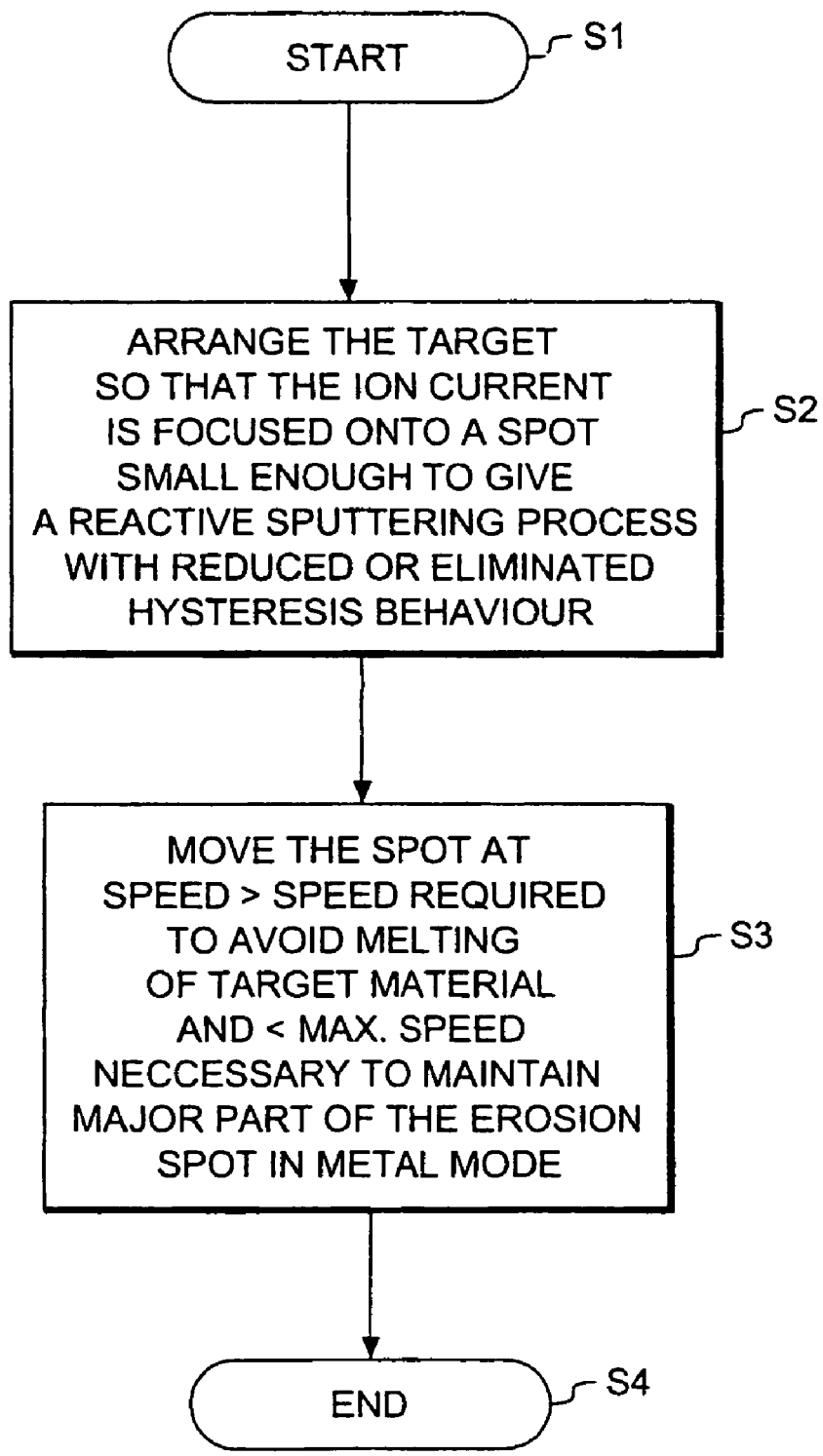
FIG. 7 is a flow chart over a method for reactive sputtering in accordance with the present invention.

FIG. 7 is a flow chart over a method for sputtering in accordance with the present invention. The sputtering process starts in a step S1. To obtain a hysteresis-free reactive sputtering process, the target is arranged to focus the ion current on an erosion spot in a step S2. The area of the erosion spot is small enough to provide a reactive sputtering process with a reduced or eliminated hysteresis behaviour, or with a high fraction of sputtered species consisting of unreacted metal enabling deposition of fully stoichiometric compound films at a rate close to a metallic sputtering rate. Movement of the erosion spot is caused in a step S3. The speed with which the erosion spot is moved is higher than the minimum speed required to avoid melting of target material and lower than a maximum speed in order to maintain a major part of the erosion spot in metal mode. The sputtering process is ended in a step S4.

It will be understood by those skilled in the art that various modifications and changes may be made to the present invention without departure from the scope and spirit thereof, as defined by the appended claims.

The invention claimed is:

1. A reactive sputtering process with an eliminated hysteresis behavior involving a cylindrical target having a cylinder-axis, the cylindrical target having magnets inside the target, wherein an erosion area parallel to the cylinder-axis is arranged on the target and reduced to form a reduced erosion area having a size smaller than a critical size needed for the sputtering process to proceed reactively with an eliminated hysteresis behavior, and causing relative movement of the target and the erosion area, the movement being at a speed above a minimum speed that avoids melting of target material and below a maximum speed that maintains a major part of the reduced erosion area in metal mode.

2. The method of claim 1, characterized in that the speed is a constant speed.

3. The method of claim 1, characterized in that the speed is low enough that substantially all species sputtered from the target are metal atoms.

4. The method of claim 1, characterized in that the reactive sputtering results in deposition of a stoichiometric compound film.

5. The method of claim 1, characterized in that the magnets inside the cylindrical target are rod magnets.

6. The method of claim 1, wherein the reactive sputtering process proceeds without arcing.

7. The method of claim 1, characterized in that the critical size creates a target current density providing sputtering of ionized species from the target.

8. The method of claim 1, wherein the erosion area having a size smaller than a critical size is established by placing a small magnet behind the target, positioning a shutter with a small aperture close to the surface of the target or splitting the target in several parts electrically isolated from each other.

9. A method for obtaining a reactive sputtering process with an eliminated hysteresis behavior comprising:
providing a reactive sputtering system including a cylindrical target having a cylinder-axis, the cylindrical target having magnets inside the target and further having an erosion area parallel to the cylinder-axis,
reducing the erosion area to a critical size needed for the reactive sputtering process to proceed reactively with an eliminated hysteresis behavior to form a reduced erosion area on the target, and
adjusting the relative movement of the target and erosion area to a speed above a minimum speed that avoids melting of target material and below a maximum speed that maintains a major part of the reduced erosion area in metal mode.

10. The method of claim 9, characterized in that the speed is a constant speed.

11. The method of claim 9, characterized in that the speed is low enough that substantially all species sputtered from the target are metal atoms.

12. The method of claim 9, characterized in that the reactive sputtering results in deposition of a stoichiometric compound film.

13. The method of claim 9, characterized in that the magnets inside the cylindrical target are rod magnets.

14. The method of claim 9, wherein the reactive sputtering process proceeds without arcing.

15. The method of claim 9, characterized in that the critical size creates a target current density providing sputtering of ionized species from the target.

16. The method of claim 9, wherein the reduced erosion area is established by placing a small magnet behind the target, positioning a shutter with a small aperture close to the surface of the target or splitting the target in several parts electrically isolated from each other.

* * * * *